United States Patent [19]

Sanpei et al.

[11] Patent Number: 5,304,915
[45] Date of Patent: Apr. 19, 1994

[54] OVERCHARGE PREVENTING DEVICE AND OVERDISCHARGE PREVENTING DEVICE FOR A SECONDARY BATTERY

[75] Inventors: Akira Sanpei, Fukushima; Kanji Murano, Tokyo, both of Japan

[73] Assignee: Sony Corporation, Tokyo, Japan

[21] Appl. No.: 872,986

[22] Filed: Apr. 24, 1992

[30] Foreign Application Priority Data

Apr. 26, 1991 [JP] Japan .................................. 3-097734

[51] Int. Cl.$^5$ ................................................ H02J 7/00
[52] U.S. Cl. ........................................ 320/14; 320/13; 320/40
[58] Field of Search .................... 320/13, 18, 14, 40

[56] References Cited

U.S. PATENT DOCUMENTS

| | | | |
|---|---|---|---|
| 3,543,043 | 11/1970 | Dunn | 320/39 X |
| 4,086,525 | 4/1978 | Ibsen et al. | 320/40 X |
| 4,237,385 | 12/1980 | Jurgens et al. | 320/13 X |
| 4,571,531 | 2/1986 | Lin | 320/14 |
| 4,583,035 | 4/1986 | Sloan | 320/22 |
| 4,622,508 | 11/1986 | Matteau et al. | 320/13 |
| 5,028,858 | 7/1991 | Schnizler et al. | 320/13 X |
| 5,153,496 | 10/1992 | Laforge | 320/13 X |
| 5,179,337 | 1/1993 | Staarman et al. | 320/13 |

FOREIGN PATENT DOCUMENTS

| | | |
|---|---|---|
| 0319020 | 6/1989 | European Pat. Off. . |
| 2438149 | 2/1976 | Fed. Rep. of Germany . |
| 3611484 | 10/1987 | Fed. Rep. of Germany . |
| 3716069 | 12/1987 | Fed. Rep. of Germany . |
| 2547420 | 1/1986 | France . |

OTHER PUBLICATIONS

Soviet Inventions Illustrated Section El in Week 8426, Aug. 8, 1984 published by Derwent Publications Ltd. pp. 12–13.
Soviet Inventions Illustrated, Section El Week D51, Feb. 3, 1982 published by Derwent Publications Ltd. p. 4.

Primary Examiner—R. J. Hickey
Attorney, Agent, or Firm—Hill, Steadman & Simpson

[57] ABSTRACT

An overcharge preventing device and an overdischarge preventing device for a nonaqueous electrolyte secondary battery having voltage detectors and are provided to respectively detect terminal voltages of batteries connected in series. A switch is provided in series to the batteries between a common terminal and a charge terminal. When the terminal voltage of at least one of the batteries exceeds a battery design voltage in charging the batteries, the switch is turned off in response to an output from the corresponding voltage detectors, thereby cutting off a charging current. Further, a voltage detector is provided to detect a terminal voltage of the series connected batteries. A switch is provided in series to the batteries between the common terminal and a discharge terminal. When the terminal voltage of the batteries becomes equal to or less than a set voltage in discharging the batteries, the switch is turned off in response to an output from the voltage detector, thereby cutting off a discharging current.

3 Claims, 7 Drawing Sheets

OVERCHARGE PREVENTING DEVICE AND OVERDISCHARGE PREVENTING DEVICE FOR A SECONDARY BATTERY

BACKGROUND OF THE INVENTION

The present invention relates to an overcharge preventing device and an overdischarge preventing device for preventing overcharge and overdischarge of a nonaqueous electrolyte secondary battery such as lithium ion secondary battery.

Construction of a nonaqueous electrolyte secondary battery, e.g., a lithium ion secondary battery is shown in FIG. 7. Referring to FIG. 7, reference numeral 1 generally denotes a lithium ion secondary battery employing LiCoO$_2$ as an active material 4 of a positive electrode 2 and carbon having a graphite structure as an active material 6 of a negative electrode 3. The active material 4 of the positive electrode 2 is held by a current collector 5 made of Al, and the active material 6 of the negative electrode 3 is held by a current collector 7 made of Cu. The active materials 4 and 6 are opposed to each other with a separator 8 interposed therebetween. An organic electrolyte 9 is filled between the active materials 4 and 6. A voltage reaction of the lithium ion secondary battery 1 is expressed by the following formula 1.

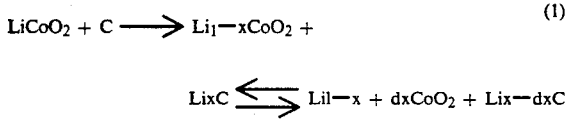

(1)

As shown in FIGS. 8 and 9, the charging and discharging characteristics of the battery 1 has a remarkable correlation between a battery capacity, that is, a charging and discharging energy and a terminal voltage of the battery (what is called a battery voltage). A solid line I in FIG. 8 is a graph illustrating the relation between the battery voltage and the charging energy. It is apparent from FIG. 8 that the battery voltage increases with an increase in the charging energy.

A solid line II in FIG. 9 is a graph illustrating the relation between the battery voltage and the discharging energy. It is apparent from FIG. 9 that the battery voltage decreases with an increase in the discharging energy.

The battery 1 has a design voltage a (see FIG. 8) to be defined by a battery component material and a battery design. To charge the battery 1 beyond the design voltage a is called overcharge. The overcharge causes the problems of (1) deposition of Li metal on the negative electrode 3, (2) decomposition of the active material 4 of the positive electrode 2 and deposition of Co metal or Co compounds on the negative electrode 3 due to cobalt ion generated by the decomposition of the active material 4, and (3) decomposition of the organic electrolyte 9. The decomposition of the Li metal, the Co metal and the Co compounds causes short-circuit of the positive and negative electrodes, and the decomposition of the active material 4 of the positive electrode 2 and the organic electrolyte 9 causes a remarkable deterioration of the battery 1. Accordingly, if the overcharge is not substantially avoided, the reliability of the battery cannot be ensured.

In discharging the charged battery 1 by connecting the same to an external load, the battery voltage decreases as shown in FIG. 9. When the discharging is continued, the battery voltage reaches a dissolution voltage b of the current collector (Cu) 7 of the negative electrode 3. To discharge the battery 1 after the dissolution voltage b is reached is called overdischarge. The overdischarge naturally causes ionization of the copper (Cu) of the current collector 7, and the copper ion is eluted into the electrolyte 9. The elution of the metal of the current collector 7 causes deterioration of a current collecting function and falling of the active material 6 of the negative electrode 3, reducing a capacity of the battery 1. Furthermore, the copper ion thus eluted is abnormally deposited on the negative electrode 3 in carrying out the charging in the next time, causing short-circuit of the positive and negative electrodes. Accordingly, the overdischarge must also be avoided.

Conventionally, the following techniques have been proposed to cope with the overcharge and the overdischarge. As the measures to the overcharge, there have been proposed (1) control of a charging voltage by a charger and (2) a current cutting device utilizing an internal pressure of the battery.

The above measure (1) to the overcharge by the charger is to control a charging terminal voltage of the battery in charging. This measure is sufficiently effective in case of a unit battery or parallel connected unit batteries. However, batteries are used often in series connection. In this case, a terminal voltage of the series connected batteries can be controlled, but the battery voltage of each unit battery cannot be controlled. Accordingly, when at least one of the unit batteries connected in series is short-circuited, the other unit batteries become overcharged in charging. Thus, this method is not a perfect measure to the overcharge.

As the current cutting device mentioned as the above measure (2), it is known to utilize an increase in internal pressure of the battery in overcharging, thereby mechanically cutting a current lead wire to cut off a charging current. This method is intended not to prevent the overcharge itself but to prevent breakdown of the battery due to an abnormal increase in temperature and internal pressure of the battery after the progress of the overcharge. Moreover, once the charging current is cut off, the battery cannot be used any more.

As the measure to the overdischarge, it is known to select the metal of the current collector of the negative electrode so that the dissolution voltage may be close to zero as the battery voltage. For example, when Cu is replaced by Ni, the effect is observed, but it is not perfect. In case of series connected batteries, the overdischarge of one of the batteries necessarily proceeds because of a difference among the individual unit batteries, causing a remarkable reduction in charging and discharging cycle life.

SUMMARY OF THE INVENTION

It is accordingly an object of the present invention to provide an overcharge preventing device and an overdischarge preventing device which can perfectly prevent the overcharge and the overdischarge of a battery and ensure the reliabilty and the safety of the battery.

According to one aspect of the present invention, there is provided an overcharge preventing device for a battery having battery voltage changing with a battery capacity; the improvement comprises voltage detecting means for detecting a voltage between opposite terminals of said battery and switch means provided in series to said battery between said battery and a charge terminal, wherein when said voltage between said opposite terminals of said battery exceeds a predetermined value (i.e., a design voltage) in charging said battery, said switch means is turned off according to an output from said voltage detecting means to cut off a charging current.

This invention can be applied to a unit battery, parallel connected batteries, two or more series connected batteries, series and parallel connected batteries, etc. In the case that this invention is applied to series connected batteries, the voltage detecting means comprises independent voltage detectors for respectively detecting the terminal voltages of the individual unit batteries.

According to another aspect of the present invention, there is provided an overdischarge preventing device for a battery having a battery voltage changing with a battery capacity. The improvement comprises voltage detecting means for detecting a voltage between opposite terminals of said battery and switch means provided in series to said battery between said battery and a discharge terminal, wherein when said voltage between said opposite terminals of said battery becomes equal to or less than a predetermined value (i.e., a set voltage) in discharging said battery, said switch means is turned off according to an output from said voltage detecting means to cut off a discharging current.

This invention can be applied to a unit battery, parallel connected batteries, two or more series connected batteries, series and parallel connected batteries, etc. In the case that this invention is applied to series connected batteries, the voltage detecting means comprises independent voltage detectors for respectively detecting the terminal voltages of the individual unit batteries. Alternatively, the voltage detecting means may comprise a single voltage detector for detecting the terminal voltage of the series connected batteries.

In the overcharge preventing device according to the present invention, in charging the battery, the battery voltage is always detected by the voltage detecting means. When the battery voltage detected exceeds the predetermined value or the design voltage, the switch means is turned off according to the output from the voltage detecting means to thereby cut off the charging current. Accordingly, the overcharge of the battery can be surely prevented. Furthermore, the serviceability of the battery can be ensured.

In the overdischarge preventing device according to the present invention, in discharging the battery by connecting the same to an external load, the terminal voltage of the battery is always detected by the voltage detecting means. When the terminal voltage detected becomes equal to or less than the predetermined value or the set voltage, the switch means is turned off according to the output from the voltage detecting means to thereby cut off the discharging current. Accordingly, the overdischarge of the battery can be surely prevented.

Additional features and advantages of the present invention are described in and will be apparent from the detailed description of the presently preferred embodiments and from the drawings.

DETAILED DESCRIPTION OF THE PRESENTLY PREFERRED EMBODIMENT

The present invention utilizes the above-mentioned correlation between the battery voltage and the battery capacity (the charging and discharging energy) of the nonaqueous solvent secondary battery. For example, a terminal voltage of series connected batteries is always detected, and when the terminal voltage detected exceeds a design voltage of the batteries, a charging current is cut off by an electronic circuit. Further, when the terminal voltage detected becomes equal to or less than a set voltage of the batteries, a discharging current is cut off by the electronic circuit. Thus, the overcharge and the overdischarge of the batteries can be perfectly prevented to ensure the reliability and the safety of the batteries.

There will now be described some preferred embodiments of the overcharge preventing device and the overdischarge preventing device according to the present invention with reference to the drawings.

Figure 1:
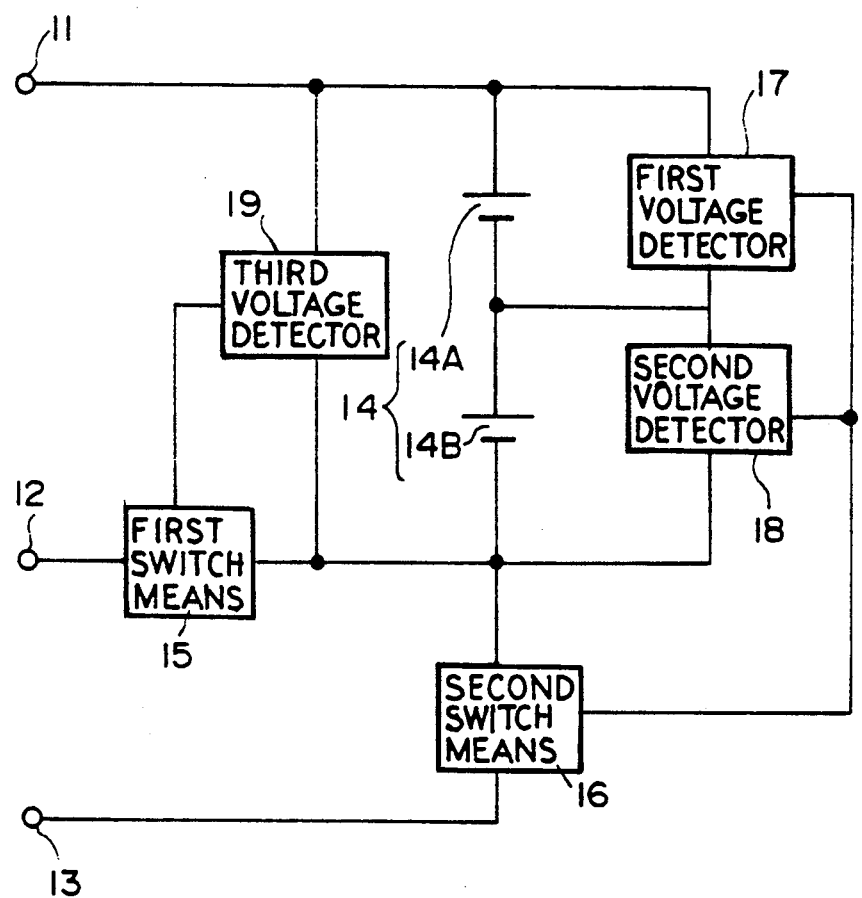
FIG. 1 is a block diagram of a basic construction illustrating a preferred embodiment of the present invention.

FIG. 1 shows a basic construction of an overcharge and overdischarge preventing device constructed of an overcharge preventing device and an overdischarge preventing device integrated together according to a first preferred embodiment of the present invention. In this preferred embodiment, two batteries connected in series are employed.

Referring to FIG. 1, the overcharge and overdischarge preventing device includes a common terminal 11, a discharge terminal 12, a charge terminal 13, and two batteries 14 (14A and 14B) connected in series. One end (positive electrode terminal) of the series connected batteries 14 is connected to the common terminal 11, and the other end (negative electrode terminal) is connected through a first switch means 15 for cutting off a discharging current to the discharge terminal 12 and is also connected through a second switch means 16 for cutting off a charging current to the charge terminal 13. A first voltage detector 17 for detecting a battery voltage of the battery 14A is connected between opposite terminals of the battery 14A, and a second voltage detector 18 for detecting a battery voltage of the battery 14B is similarly connected between opposite terminals of the battery 14B. Outputs of the first and second voltage detectors 17 and 18 are connected to the second switch means 16. The first and second voltage detectors 17 and 18 and the second switch means 16 constitute the overcharge preventing device. Further, a third voltage detector 19 for detecting a battery voltage of the series connected batteries 14 is connected between opposite terminals of the series connected batteries 14, and an output of the third voltage detector 19 is connected to the first switch means 15. The third voltage detector 19 and the first switch means 15 constitute the overdischarge preventing device.

The batteries 14A and 14B are nonaqueous electrolyte secondary batteries such as lithium ion secondary batteries as previously mentioned. It is preferable that the voltage detectors 17, 18 and 19 are low in power consumption and high in voltage detection accuracy. It is preferable that the switch means 15 and 16 are low in on-resistance for a large current.

Figure 8:
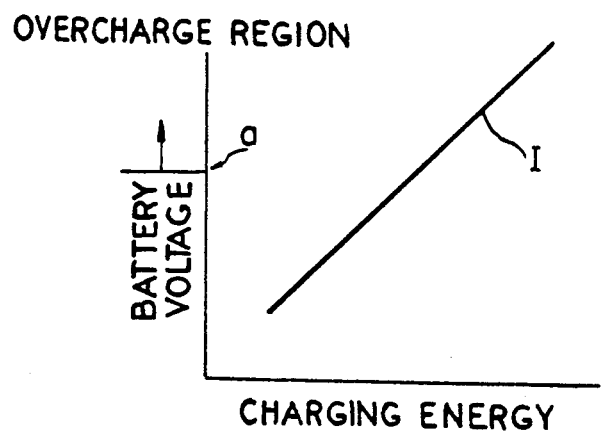
FIG. 8 is a graph illustrating the relation between a charging energy and a battery voltage of a lithium ion secondary battery.

In charging the two batteries 14A and 14B connected in series by connecting the common terminal 11 and the charge terminal 13 to a charging power source, the second switch means 16 is turned on to carry out the charging while the terminal voltages of the batteries 14A and 14B are individually detected by the first and second voltage detectors 17 and 18, respectively. When the terminal voltage of at least one of the batteries 14A and 14B, e.g., the terminal voltage of the battery 14A exceeds a design voltage (see FIG. 8), the second switch means 16 is turned off according to an output from the first voltage detector 17 corresponding to the battery 14A, thereby cutting off a charging current to prevent the overcharge.

Figure 9:
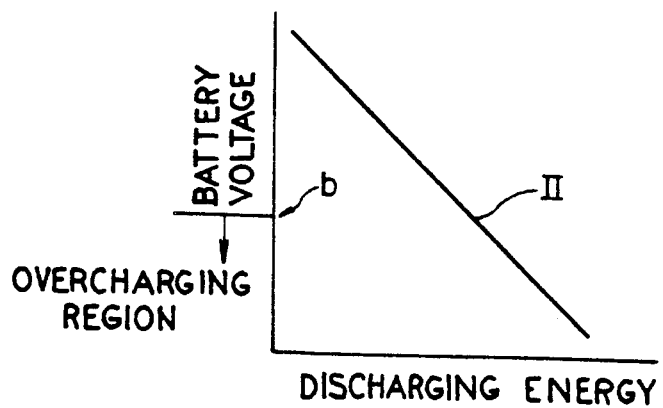
FIG. 9 is a graph illustrating the relation between a discharging energy and a battery voltage of a lithium ion secondary battery.

In discharging the charged batteries 14 by connecting the common terminal 11 and the discharge terminal 12 to an external load, the first switch means 15 is turned on to carry out the discharging while the terminal voltage of the series connected batteries 14 is detected by the third voltage detector 19. When the terminal voltage of the batteries 14 becomes equal to or less than a set voltage b (see FIG. 9) which is defined as a higher one of a dissolution voltage of a current collector metal constituting a negative electrode of the batteries 14 and a cut-off voltage of an equipment as the external load, the first switch means 15 is turned off according to an output from the third voltage detector 19, thereby cutting off a discharging current to prevent the overdischarge.

Figure 2:
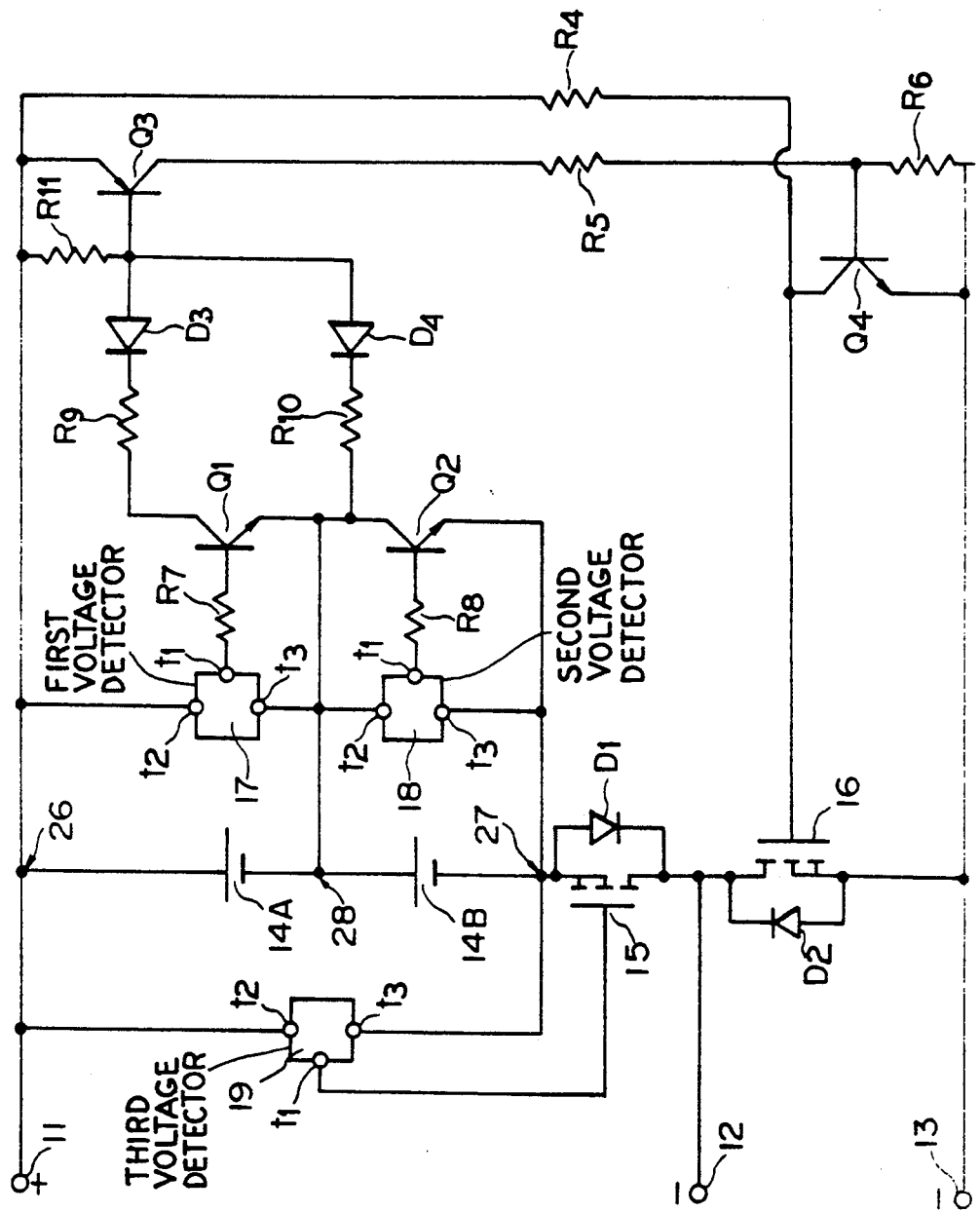
FIG. 2 is a circuit diagram of an electronic circuit according to the preferred embodiment shown in FIG. 1.

FIG. 2 shows a specific example of an electronic circuit corresponding to the basic construction mentioned above.

One end (positive electrode terminal) of the series connected batteries 14 (14A and 14B) is connected to the common terminal (plus terminal) 11, and the other end (negative electrode terminal) is connected to the charge terminal (minus terminal) 13 through the first switch means 15 such as an n-channel FET and the second switch means 16 such as an n-channel FET. Further, a middle junction point between the first and second n-channel FETs 15 and 16 is connected to the discharge terminal (minus terminal) 12. $D_1$ and $D_2$ denote parasitic diodes.

The common terminal 11 is connected through a resistor $R_4$ to the gate of the second n-channel FET 16. Further, the common terminal 11 is connected through a pnp transistor $Q_3$ and resistors $R_5$ and $R_6$ to the charge terminal 13. An npn transistor $Q_4$ is connected between the gate and the source (connected to the charge terminal 13) of the second n-channel FET 16. The gate of the npn transistor $Q_4$ is connected to a middle junction point between the resistors $R_5$ and $R_6$.

Figure 3:
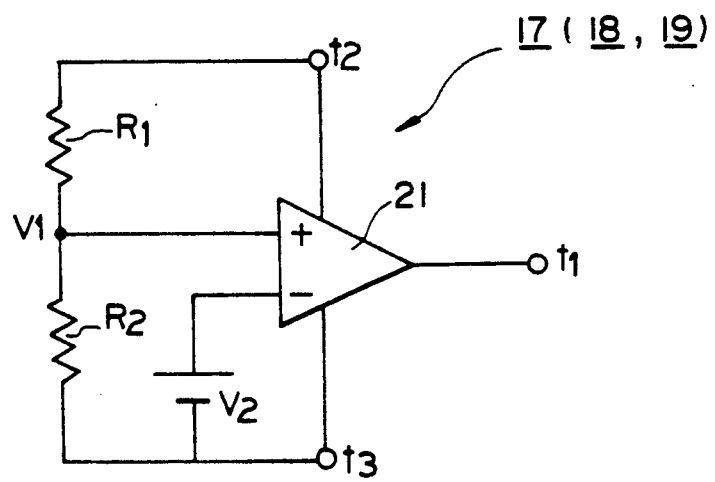
FIG. 3 is a circuit diagram of a voltage detector shown in FIG. 2.

As shown in FIG. 3, each of the first, second and third voltage detectors 17, 18 and 19 is constructed of a comparator 21 having an output terminal $t_1$, a plus power terminal $t_2$ and a minus power terminal $t_3$. A reference voltage $V_2$ is applied to a minus input terminal of the comparator 21. Resistors $R_1$ and $R_2$ are connected between the plus power terminal $t_2$ and the minus power terminal $t_3$. A voltage $V_1$ at a middle junction point between the resistors $R_1$ and $R_2$ is applied to a plus input terminal of the comparator 21. In this voltage detector 17 (18, 19), when $V_1 < V_2$, a voltage $V_{t1}$ at the output terminal $t_1$ is equal to a voltage $V_{t3}$ at the minus power terminal $t_3$ ($V_{t1} = V_{t3}$), while when $V_1 > V_2$, the voltage $V_{t1}$ at the output terminal $t_1$ is equal to a voltage $V_{t2}$ at the plus power terminal $t_2$ ($V_{t1} = V_{t2}$)

In the first and second voltage detectors 17 and 18, when a voltage between the terminals $t_2$ and $t_3$ is equal to or less than the design voltage (e.g., 4.3 V) of the unit batteries 14A and 14B, $V_1 < V_2$ is given, while when the voltage between the terminals $t_2$ and $t_3$ exceeds the design voltage, $V_1 > V_2$ is given. On the other hand, in the third voltage detector 19, the voltage between the terminals $t_2$ and $t_3$ is equal to or less than the set voltage (e.g., 4.3 V as a terminal voltage in case of the two series connected batteries), $V_1 > V_2$ is given, while when the voltage between the terminals $t_2$ and $t_3$ is more than the set voltage, $V_1 < V_2$ is given.

The output terminal $t_1$ of the third voltage detector 19 for detecting a discharging voltage is connected to the gate of the first n-channel FET 15 as the first switch means. The plus power terminal $T_2$ of the third voltage detector 19 is connected to the common terminal 11, that is, one end (positive electrode terminal) of the batteries 14. The minus power terminal $t_3$ of the third voltage detector 19 is connected to the other end (negative electrode terminal) of the batteries 14. Further, the plus power terminal $t_2$ of the first voltage detector 17 for detecting a terminal voltage of the battery 14A is connected to the positive electrode terminal of the battery 14A. The minus power terminal $t_3$ of the first voltage detector 17 is connected to the negative electrode terminal of the battery 14a. The output terminal $t_1$ of the first voltage detector 17 is connected through a resistor $R_7$ to the base of an npn transistor $Q_1$ constituting a switching circuit. The emitter of the transistor $Q_1$ is connected to the minus power terminal $t_3$ of the first voltage detector 17, and the collector of the transistor $Q_1$ is connected through a resistor $R_9$ and a diode $D_3$ to the base of the pnp transistor $Q_3$. Further, the plus power terminal $t_2$ of the second voltage detector 18 for detecting a terminal voltage of the battery 14B (i.e., the middle junction point between the batteries 14A and 14B). The minus power terminal of the second voltage detector 18 is connected to the negative electrode terminal of the battery 14B. The output terminal $t_1$ of the second voltage detector 18 is connected through a resistor $R_8$ to the base of an npn transistor $Q_2$ constituting a switching circuit. The emitter of the transistor $Q_2$ is connected to the minus power terminal $t_3$ of the second voltage detector 18, and the collector of the transistor $Q_2$ is connected through a resistor $R_{10}$ and a diode $D_4$ to the base of the pnp transistor $Q_3$. Further, a resistor $R_{11}$ is connected between the base and the emitter of the pnp transistor $Q_3$.

Now, the operation of the circuit shown in FIG. 2 will be described. First, there will be described the case of charging the series connected batteries 14 by connecting the common terminal 11 and the charge terminal 13 to a charging power source. In the initial stage of charging, $V_1 < V_2$ is given in the first and second voltage detectors 17 and 18, and accordingly the voltage $V_{t1}$ at the output terminal $t_1$ is equal to the voltage $V_{t3}$ at the minus power terminal $t_3$. Therefore, both the transistors $Q_1$ and $Q_2$ are in an off state. On the other hand, the first n-channel FET 15 is in an on state. Accordingly, a plus voltage is applied through the common terminal 11 to the gate of the second n-channel FET 16, thereby turning on the second n-channel FET 16, so that a charging current flows from the common terminal 11 through the batteries 14A and 143, the first n-channel FET 15 and the second n-channel FET 16 to the charge terminal 13, thus charging the batteries 14A and 14B.

In the proceeding of the charging, when a charging voltage of at least one of the batteries 14A and 14B, e.g., a charging voltage of the battery 14A exceeds the design voltage a, $V_1 > V_2$ is given in the first voltage detector 17, and accordingly the voltage $V_{t1}$ at the output terminal $t_1$ becomes equal to the voltage $V_{t2}$ at the plus power terminal $t_2$, thereby applying a plus voltage to the base of the transistor $Q_1$ to turn on the transistor $Q_1$. When the transistor $Q_1$ goes on, the pnp transistor $Q_3$ goes on, and the transistor $Q_4$ accordingly goes on to thereby turn off the second n-channel FET 16, thereby cutting off a charging current. In contrast, when a charging voltage of the battery 14B exceeds the design voltage a earlier, the voltage $V_{t1}$ at the output terminal $t_1$ of the second voltage detector 18 becomes equal to the voltage $V_{t2}$ at the plus power terminal $t_2$, thereby turning off the second n-channel FET 16 according to an output from the second voltage detector 18 and cutting off a charging current. Thus, the charging is stopped to prevent the overcharge of the batteries 14A and 14B.

Next, there will be described the case of discharging the charged batteries 14 (14A and 14B) by connecting the common terminal 11 and the discharge terminal 12 to an external load. A discharging current flows from the discharge terminal 12 through the first n-channel FET 15 and the batteries 14B and 14A to the common terminal 11. In the proceeding of the discharging, when the capacity of the series connected batteries 14A and 14B decreases to become equal to or less than the set voltage b, $V_1 < V_2$ is given in the third voltage detector 19, and accordingly the voltage $V_{t1}$ at the output terminal $t_1$ becomes equal to the voltage $V_{t3}$ at the minus power terminal $t_3$. Therefore, the first n-channel FET 15 is turned off by the output voltage of the third voltage detector 19, thereby cutting off a discharging current. Thus, the discharging is stopped to prevent the overdischarge of the batteries 14A and 14B.

In this manner, according to this preferred embodiment, it is possible to prevent the overcharge wherein the terminal voltage of the unit battery exceeds 4.3 V and also prevent the overdischarge wherein the terminal voltage of the two series connected batteries becomes equal to or less than 4.3 V.

Figure 4:
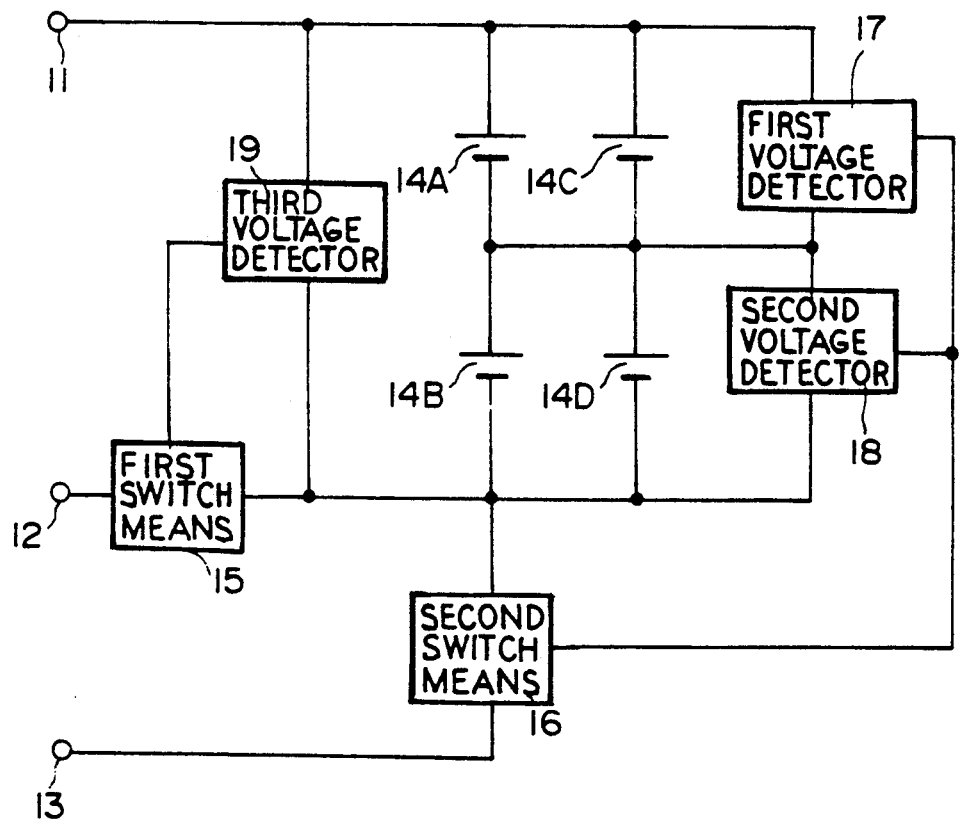
FIG. 4 is a block diagram of a basic construction illustrating another preferred embodiment of the present invention.

FIG. 4 shows a second preferred embodiment of the present invention wherein four batteries 14 (14A, 14B, 14C and 14D) are connected in series and parallel. In FIG. 4, parts corresponding to those shown in FIG. 1 are designated by the same reference numerals, and the explanation thereof will be omitted hereinafter. In charging the batteries 14, when a charging voltage of at least one of the batteries 14A and 14C exceeds the design voltage a, the switch means 16 is turned off according to the output from the first voltage detector 17. Further, when a charging voltage of at least one of the batteries 14B and 14D exceeds the design voltage a, the switch means 16 is turned off according to the output from the second voltage detector 18. Thus, a charging current is cut off to thereby prevent the overcharge of the batteries 14A, 14B, 14C and 14D. In discharging the batteries 14, when a terminal voltage of at least one of the series connected batteries 14A and 14B and the series connected batteries 14C and 14D becomes equal to or less than the set voltage b, the switch means 15 is turned off according to the output from the third voltage detector 19, thereby cutting off a discharging current to prevent the overdischarge. This preferred embodiment may employ the electronic circuit shown in FIG. 2 for the overcharge and overdischarge preventing device.

Figure 5A:
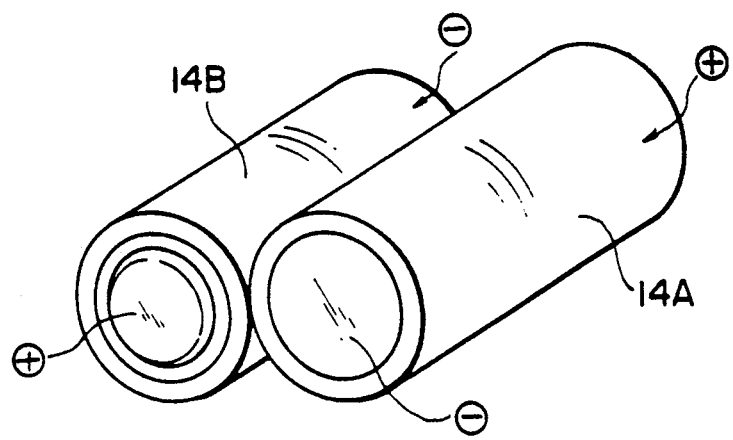
FIGS. 5A and 5B are perspective views illustrating a manufacturing process (first stage) of a battery pack to which the present invention is applied.
Figure 5B:
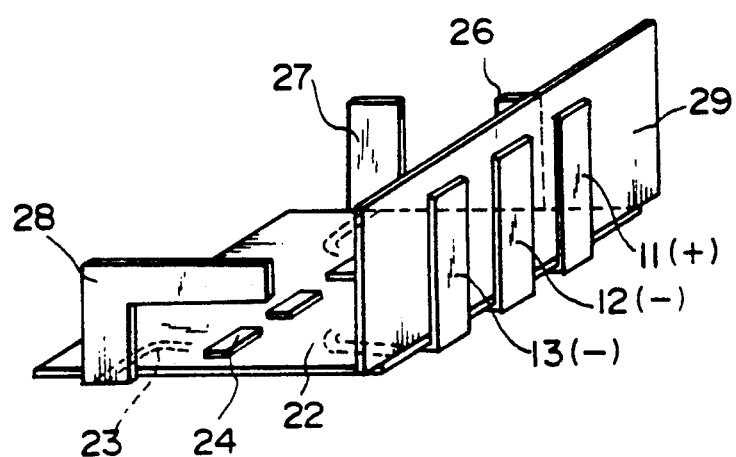
Figure 6A:
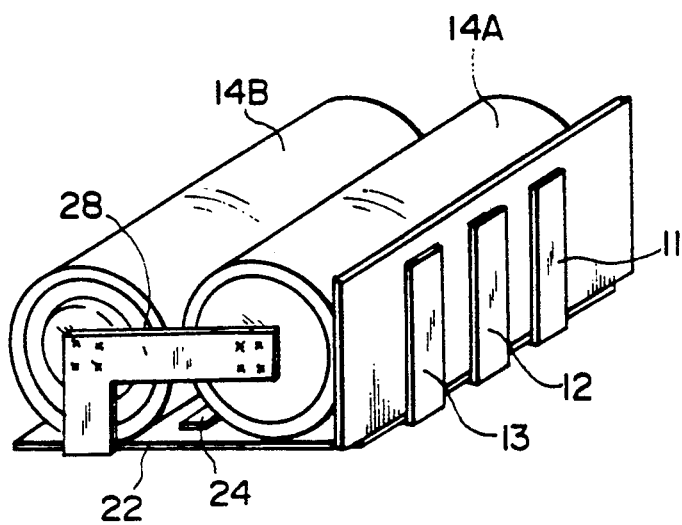
FIGS. 6A and 6B perspective views illustrating the manufacturing process (second stage) to be continued from FIGS. 5A and 5B.
Figure 6B:
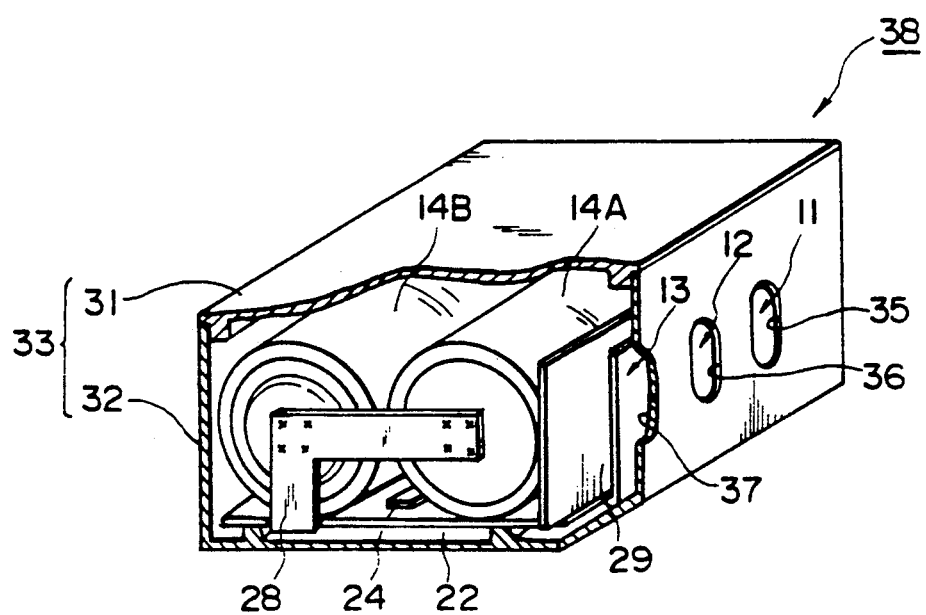
Figure 7:
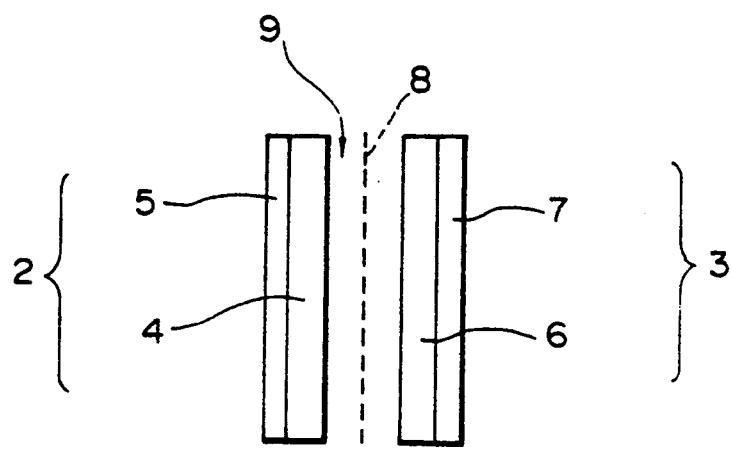
FIG. 7 is a schematic illustration of a lithium ion secondary battery.

FIGS. 5A, 5B, 6A and 6B show an example of a battery pack incorporating the overcharge and overdischarge preventing circuit shown in FIG. 2. Referring to FIGS. 5A and 5B, reference numeral 22 denotes a printed circuit board having a lower surface on which a wiring pattern 23 corresponding to the circuit shown in FIG. 2 is formed and having an upper surface on which circuit parts 24 are mounted. The printed circuit board 22 has a size such that the two batteries 14A and 14B to be connected in series can be juxtaposed. One end of the printed circuit board 22 is formed with a positive electrode tab 26 projecting upwardly so as to be connected to the positive electrode terminal of the battery 14A and is also formed with a negative electrode tab 27 projecting upwardly so as to be connected to the negative electrode terminal of the battery 14B. Further, the other end of the printed circuit board 22 is formed with a junction tab 28 projecting upwardly so as to be commonly connected to the negative electrode terminal of the battery 14A and the positive electrode terminal of the battery 14B. Further, one side edge of the printed circuit board 22 is formed with a terminal fixing plate 29 projecting upwardly so that the common terminal 11, the discharge terminal 12 and the charge terminal 13 are fixed on an outer surface of the terminal fixing plate 29. All of the common terminal 11, the discharge terminal 12, the charge terminal 13, and the tabs 26, 27 and 28 are connected to the wiring pattern 23 of the printed circuit board 22. The circuit parts 24 are mounted at the center of the upper surface of the printed circuit board 22 where a space is defined between the two batteries 14A and 14B juxtaposed on the upper surface of the printed circuit board 22. The positions corresponding to the tabs 26, 27 and 28 are represented by the same reference numerals in FIG. 2, respectively. As shown in FIG. 6A, the two batteries 14A and 14B are put on the printed circuit board 22. Under the condition, the positive electrode terminal of the battery 14A and the positive electrode tab 26 are fixedly connected together electrically and mechanically by welding, for example. Similarly, the negative electrode terminal of the battery 14A and the negative electrode tab 27 are fixedly connected together electrically and mechanically by welding, for example. Further, the negative electrode terminal of the battery 14A and the positive electrode terminal of the battery 14B are fixedly connected to the junction tab 28 electrically and mechanically by welding, for example. Thus, the batteries 14A and 14B and the printed circuit board 22 are integrated together, and this assembly is accommodated into a battery case 33 consisting of an upper case 31 and a lower case 32. The lower case 32 is formed with openings 35, 36 and 37 respectively corresponding to the common terminal 11, the discharge terminal 12 and the charge terminal 13. In the accommodated condition of the assembly in the battery case 33, the common terminal 11, the discharge terminal 12 and the charge terminal 13 are exposed to the openings 35, 36 and 37 of the lower case 32, respectively. In this manner, a battery pack 38 capable of preventing the overcharge and the overdischarge is constructed as shown in FIG. 6B.

Although the single third voltage detector 19 is provided between the opposite terminals of the two series connected batteries in the above preferred embodiments illustrated in FIGS. 1 and 4, the third voltage detector 19 may be provided between the opposite terminals of each of the series connected batteries.

The electronic circuit mentioned above is an example of circuits for realizing the technical idea of the present invention, and it is needless to say that the elements, the circuit system, and the set voltage to be employed are arbitrary. The electronic circuit may be applied to a unit battery or three or more series connected batteries, for example. Further, a part or all of the electronic circuit may be built in the inside or outside of the battery, the battery pack, or a charger.

Although the overcharge preventing device and the overdischarge preventing device are combined together in the above preferred embodiments illustrated in FIGS. 1 and 4, the overcharge preventing device and the overdischarge preventing device may be individually employed. For example, the overcharge preventing device only may be built in the charger, or the overdischarge preventing device only may be built in the battery pack.

Further, although the above preferred embodiments are applied to a lithium ion secondary battery, the present invention may be, of course, applied to any other nonaqueous electrolyte secondary batteries.

According to the preferred embodiments mentioned above, the overcharge can be prevented in charging the battery. Accordingly, it is possible to avoid the decomposition of the active material of the positive electrode of the battery, the decomposition of the electrolyte of the battery, the internal short-circuit of the battery, the abnormal increase in temperature and internal pressure of the battery, and the breakdown of the battery due to the abnormal increase in temperature and internal pressure. Further, the overdischarge can be prevented in discharging the battery by connecting the same to an external load. Accordingly, it is possible to avoid a reduction in capacity of the battery, a reduction in charging cycle life, and internal short-circuit of the battery. Consequently, the serviceability, the reliability and the safety of the battery can be ensured.

According to the present invention, the overcharge can be prevented in charging a battery. Further, the overdischarge can be prevented in discharging the battery. Accordingly, the breakdown of the battery can be avoided, and the reliability and the safety of the battery can be ensured.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

We claim as our invention:

1. An overcharge preventing device for a battery having a battery voltage changing with a battery capacity, the improvement comprising:

voltage detecting means for detecting a voltage between opposite terminals of said battery; and switch means provided in series with said battery between said battery and a charge terminal, wherein when said voltage between said opposite terminals of said battery exceeds a predetermined value during charging of said battery, said switch means is turned off in response to an output from said voltage detecting means to cut off a charging current wherein said switch means comprises an n-channel FET and a parasitic diode.

2. An overdischarge preventing device for a battery having a battery voltage charging with a battery capacity, the improvement comprising:

voltage detecting means for detecting a voltage between opposite terminals of said battery; and switch means provided in series with said battery between said battery and a discharge terminal, wherein when said voltage between said opposite terminals of said battery becomes equal to or less than a predetermined value during discharging of said battery, said switch means is turned off in response to an output from said voltage detecting means to cut off a discharging current wherein said switch means comprises an n-channel FET and a parasitic diode.

3. A battery pack having an overcharging preventing device and an overdischarging preventing device comprising:

a first battery and a second battery connected in series;

a first voltage detector and a second voltage detector provided to detect battery voltage of said first battery and said second battery, respectively;

a third voltage detector provided to detect battery voltage of said series connected batteries;

a first switch provided in series with said batteries between a common terminal and a charging terminal, said second switch comprising a second n-channel FET and a second parasitic diode; and a second switch provided in series with said batteries between said common terminal and a discharging terminal, said first switch comprising a first n-channel FET and a first parasitic diode;

wherein when battery voltage of at least one of said first battery and said second battery exceeds a battery design voltage during charging, said first switch is turned off to cut off charging of a current supply, and when voltage detected by said third voltage detector becomes equal to or less than a set voltage during discharging, said second switch is turned off to cut off discharge of the current supply.

* * * * *